US007007203B2

(12) United States Patent
Gorday et al.

(10) Patent No.: US 7,007,203 B2
(45) Date of Patent: Feb. 28, 2006

(54) ERROR CHECKING IN A RECONFIGURABLE LOGIC SIGNAL PROCESSOR (RLSP)

(75) Inventors: Robert Mark Gorday, Wellington, FL (US); David Taubenheim, Deerfield Beach, FL (US); Clinton Powell, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 561 days.

(21) Appl. No.: 10/211,737

(22) Filed: Aug. 2, 2002

(65) Prior Publication Data

US 2004/0025086 A1 Feb. 5, 2004

(51) Int. Cl.
*G06F 11/00* (2006.01)

(52) U.S. Cl. .......................... 714/37; 714/725; 714/21

(58) Field of Classification Search .................... 714/4, 714/21, 37, 725
See application file for complete search history.

(56) References Cited

U.S. PATENT DOCUMENTS

| | | | | |
|---|---|---|---|---|
| 5,159,599 A * | 10/1992 | Steele et al. | 714/725 |
| 5,768,288 A * | 6/1998 | Jones | 714/725 |
| 5,793,687 A * | 8/1998 | Deans et al. | 365/201 |
| 5,999,990 A * | 12/1999 | Sharrit et al. | 710/8 |
| 6,550,030 B1 * | 4/2003 | Abramovici et al. | 714/725 |
| 6,553,523 B1 * | 4/2003 | Lindholm et al. | 714/725 |
| 6,577,229 B1 * | 6/2003 | Bonneau et al. | 340/10.41 |
| 6,668,237 B1 * | 12/2003 | Guccione et al. | 702/119 |
| 6,772,381 B1 * | 8/2004 | Somchit et al. | 714/725 |
| 6,795,940 B1 * | 9/2004 | Goto | 714/42 |
| 2003/0023771 A1 * | 1/2003 | Erickson et al. | 709/327 |

* cited by examiner

*Primary Examiner*—Robert Beausoliel
*Assistant Examiner*—Gabriel L. Chu
(74) *Attorney, Agent, or Firm*—Sylvia Chen

(57) ABSTRACT

A reconfigurable logic signal processor system (RLSP) (100) and method of error checking same in accordance with certain embodiments of the present invention loads configuration data capable of processing an air interface or portion thereof in a wireless system from a configuration storage memory (112) into reconfigurable resources (104), reads back the configuration data from the reconfigurable resources (104), reads expected results from the configuration storage memory (112), and executes a verification algorithm on the configuration data read back from the reconfigurable resources (104). A portion of the reconfigurable resources (104) of the RLSP system (100) may be utilized to implement the error checking upon itself. If an error is found in the configuration data, steps can be taken to activate another base configuration data to implement a functional base air interface in a wireless communication system and request downloading (if available) from the network of the erroneous configuration data.

25 Claims, 7 Drawing Sheets

ERROR CHECKING IN A RECONFIGURABLE LOGIC SIGNAL PROCESSOR (RLSP)

FIELD OF THE INVENTION

This invention relates generally to the field of Reconfigurable Logic Signal Processors (RLSP). More particularly, this invention relates to error checking of an RLSP configuration and error correction of an RLSP configuration in an RLSP system.

BACKGROUND OF THE INVENTION

Next generation wireless communication products are being designed with modem architectures capable of supporting many wireless protocols (communication modes). In order to minimize the cost, power, and size of these multimode modems, some of these architectures will be designed for increased software configurability with a minimized set of hardware resources necessary for implementing a set of wireless protocols. The general term Software Definable Radio (SDR) is often used for these new modem architectures.

Some of these new SDR architectures may have traditional Digital Signal Processors (DSPs) and newer Reconfigurable Logic Signal Processors (RLSPs). Both types of signal processing structures use hardware which is configured/controlled via software. However, the RLSP architectures have many parallel processing structures that are individually reconfigurable, in some cases by another processor. Each structure of a reconfigurable resource is configured when configuration data bits are loaded into the configuration registers of that structure. The combined set of configuration bits of all resources is analogous to a very large instruction word that may have hundreds, thousands or even tens of thousands or more bits in the word. These reconfigurable parallel processing resources are capable of performing a complex signal processing task in as little as one clock cycle. As such, they are well suited for data-path signal processing tasks such as CDMA (Code Division Multiple Access) chip rate processing. The structures are configured by loading a bit pattern, representing configuration data into the reconfigurable resources of the RLSP.

It is noted that the above software defined radio may be in an environment in which more than one wireless protocol or air interface (AI) standard may be present. The bit patterns which implement the processing of an air interface in the RLSP are stored in configuration storage memory. This memory can contain the bit patterns to enable processing of a number of air interfaces. The air interface which the RLSP processes in an SDR is defined by the current contents of the configuration registers in the RLSP. When an air interface is called into action, the bit pattern is copied from the configuration storage memory to the configuration registers. In some cases, more than one arrangement of the RLSP may be necessary to implement signal processing for an air interface, essentially time-sharing the reconfigurable hardware resources.

The RLSP is well suited to process the physical layer of a communications link. As noted previously, the configuration data is analogous to a very long instruction word. This configuration data may be susceptible to corruption by, for example, electrostatic discharge (ESD). The configuration data may also be the target of malicious activities and thus corrupted by a hacker. This can result in loss of security, communication failure or transmission outside legal boundaries of power, frequency, bandwidth, etc.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION OF THE INVENTION

Figure 1:
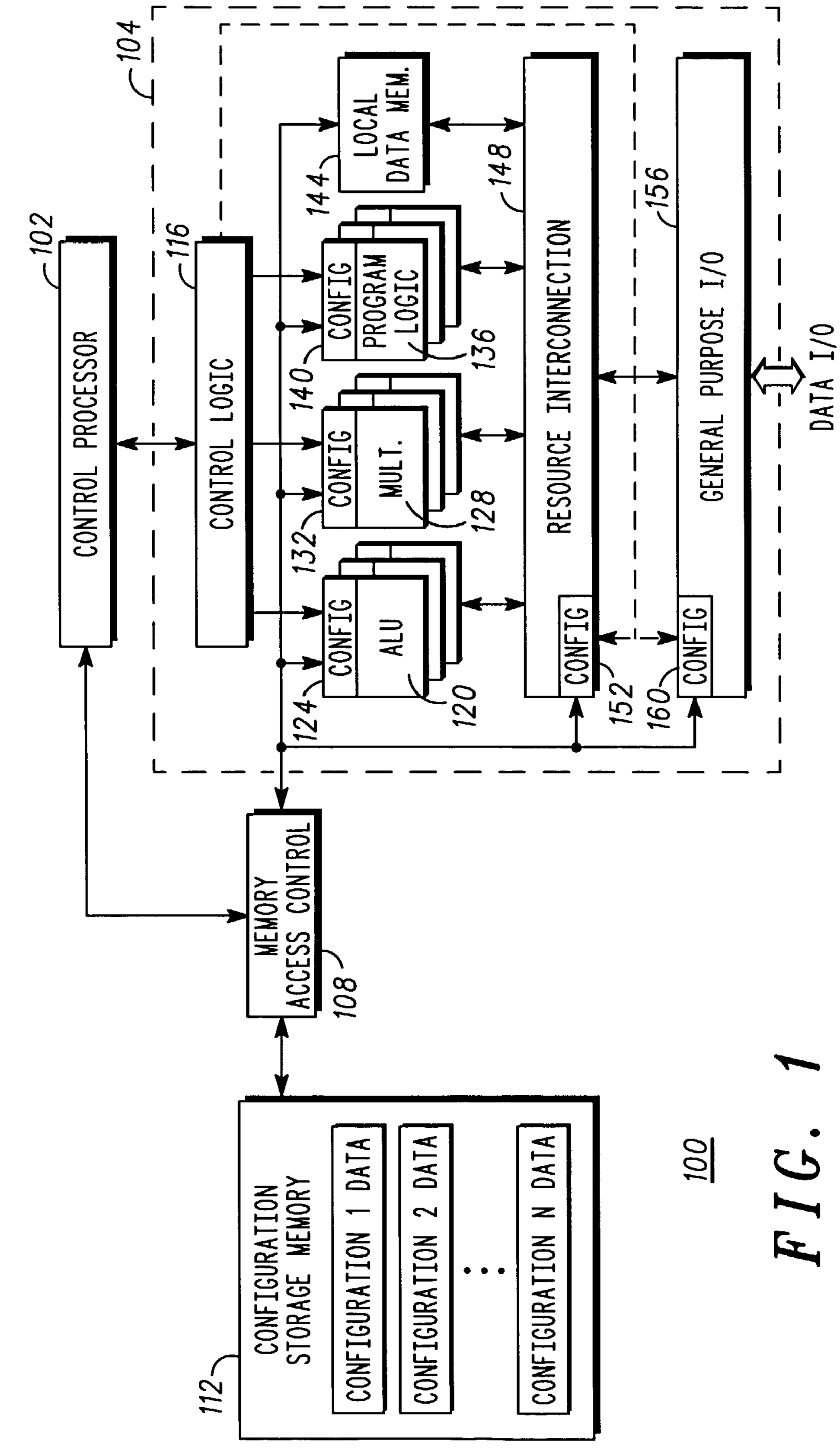
FIG. 1 is a block diagram depicting a first RLSP architecture consistent with certain embodiments of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings.

Turning now to FIG. 1, a reconfigurable logic signal processor system 100 is illustrated. Within the RLSP system 100, a control processor 102 which may have an associated control processor memory (not shown), connects to reconfigurable resources 104 at a control logic unit 116. The control processor 102 also connects to a memory access controller (MAC) 108. The MAC 108 connects to a configuration storage memory 112. The MAC 108 connects to the reconfigurable resources 104 at an arithmetic logic unit (ALU) 120 at a configuration interface 124, a multiply unit 128 at a configuration interface 132, a programmable logic unit 136 at a configuration interface 140, a resource interconnect unit 148 at a configuration interface 152, a general purpose input output unit 156 at a configuration interface 160, and to a local data memory 144.

Within the reconfigurable resources block 104 the control logic unit 116 connects to the ALU 120 at the configuration interface 124, the multiply unit (MPY) 128 at the configuration interface 132, the programmable logic unit 136 at the configuration interface 140, the resource interconnect unit 148 at the configuration interface 152, and the general purpose input output unit 156 at the configuration interface 160. The resource interconnect unit 148 connects to the local data memory 144, the programmable logic unit 136, the multiply divide unit 128, the ALU 120, and the General Purpose Input Output (GPIO) unit 156.

As the wireless modem is made more software controllable, the operation of the transmitter and receiver are exposed to more failure modes such as corruption of instruction/configuration data memory. This could result in lower reliability for SDR modems. While the RLSP is well-suited to process the physical layer of a communications link, errors in the configuration of the RLSP can threaten the integrity of a multi-user network. For instance, it is easy to imagine how a misconfigured memory pointer of a pulse-shaping filter can cause a radio to emit signals which fall outside allowed frequency and power bounds, thus disrupting normal operation of a wireless network. If one byte of the RLSP configuration data gets corrupted while in configuration storage RAM, then when it is loaded into the resource configuration registers it can result in unpredictable behavior. This is especially a concern for transmit functions, where unintended interference can result. Methods are needed to ensure the integrity of the DSP instruction data and RLSP configuration data.

In accordance with certain embodiments of the invention the software is verified when the modem is reconfigured to implement a new wireless protocol, verify new user-loaded software or new system loaded software. Additionally, the software can be periodically verified while a specific modem configuration is operating to protect against memory corruption. Regardless of the specific implementation, should the configuration storage memory 112 become corrupted as it is loaded into the reconfigurable resources 104 or after it resides on the reconfigurable resources 104 in configuration registers, steps can be taken to ensure that the integrity of the radio is restored. As mentioned above, the effect of corruption of the configuration storage memory 112 or the configuration registers can result in something as simple as not receiving a call. On the other hand, a corruption can affect an entire network by causing the transmission of non-protocol-compliant signals or transmission of signals outside an allotted bandwidth.

While the addition of the RLSP system 100 to this SDR architecture significantly increases the software configurability and therefore increases reliability concerns, its addition also offers opportunities to implement new methods of software verification that can perform execution-time or near-execution-time verification of DSP instruction data and RLSP configuration data. Improvements relative to previous methods are possible due to differences between the architectures of the previous DSP modems and new RLSP-based modems.

For a traditional DSP or microprocessor architecture, instructions are sequentially loaded from volatile memory (RAM) into the processor core to execute sequential operations. Instructions are often stored in RAM that is shared for instructions and data, introducing the possibility for inadvertently overwriting instructions with data. Previous error detection methods would either perform pre-fetch detection of invalid single instructions, pre-fetch comparison of cached instructions to instructions stored in RAM, or non-execution-time error detection of instructions stored in RAM. Performing instruction error detection at or near execution time would require the addition of dedicated hardware resources, which did not exist on the traditional DSPs. Performing periodic, non-execution-time, error detection can detect some instances of corrupted memory. However, periodic, nonexecution-time, error detection can miss errors caused by overwriting instruction memory during modem operation.

When using RLSP-based architectures, many operations are effectively loaded from RAM into configuration registers, and the configured signal processing resources operate in parallel over a number of clock cycles. Two conditions now exist which can enable higher confidence software verification.

First, a single configuration is loaded from configuration storage memory 112 into the configuration registers distributed throughout the reconfigurable resources 104. This configuration implements a complex algorithm (including conditional logic that would be implemented by branching in a microprocessor). This configuration may persist for a number of clock cycles before it is overwritten by new configuration data. This allows the opportunity for the configuration data to be read back from the configuration registers and tested while the configuration data is still the active configuration controlling signal processing.

Second, the RLSP has many, individually configured parallel processors, thus resources are available to temporarily dedicate to error detection while the rest of the resources are configured to perform the required signal processing tasks. This enables a configuration to be somewhat self-checking and avoids the use of dedicated resources to implement instruction/configuration data checking.

For a radio architecture having a RLSP system 100 and a control processor 102, configuration bit patterns are stored in identifiable locations, such as configuration storage memory 112 for the reconfigurable resources 104. (Note that this memory can be the same memory that stores data or instructions for a control processor or can be dedicated for use in storing configuration data.) The configuration storage memory 112 is loaded into the RLSP system 100's reconfigurable resources 104 as ordered by the control processor 102 or by a process executing on the RLSP system 100 itself.

For the SDR architectures, the new combination of both traditional DSPs and new powerful RLSP architectures provides unique opportunities for new methods to significantly improve execution-time verification of embedded software. Several methods that are based on the new architectures are described below.

Functions implemented in RLSP architectures may be implemented with an "active" (or primary) configuration and a series of "next-up" configurations. The active configuration has a bit pattern which describes how the RLSP system 100's reconfigurable resources 104 behave presently, while a next-up configuration remains inactive until the instruction is given to make it the active configuration. The switch between configurations can take place in as little time as a single clock cycle. In this embodiment, the active configuration can check itself as well as checking the next-up configuration.

Figure 2:
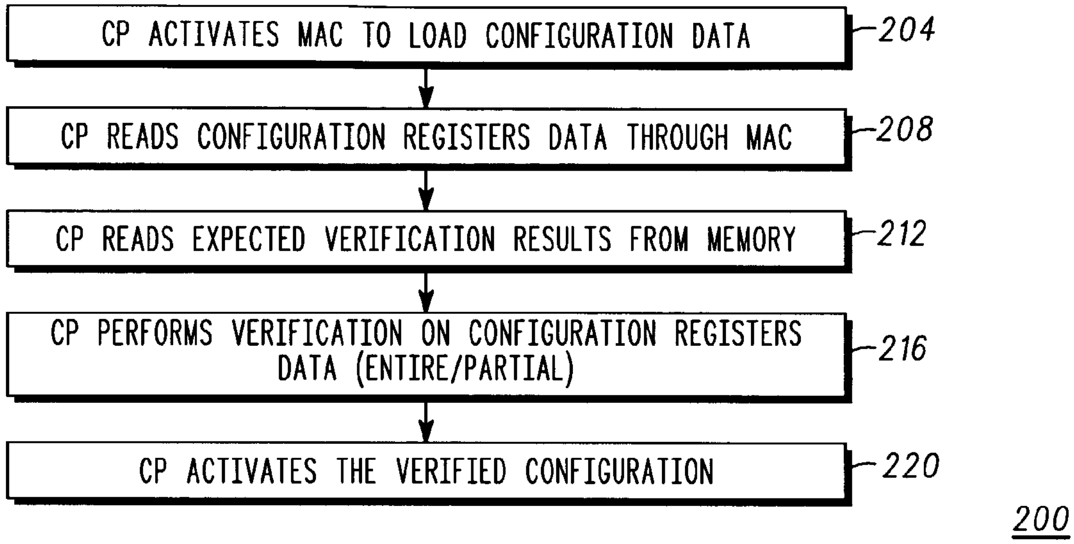
FIG. 2 is a flow chart depicting a first method of error checking a RLSP configuration consistent with certain embodiments of the present invention.

One method consistent with certain embodiments of the invention uses control processor verification of loaded configuration data. This method is depicted as method 200 in FIG. 2. Referring to FIG. 1 in conjunction with FIG. 2, the control processor 102 activates the memory access controller (MAC) 108 at 204 to load configuration data from the configuration storage memory 112 into the configuration registers distributed throughout the reconfigurable resources 104. These configuration registers are memory mapped to allow the MAC 108 to perform this task. The data busses are designed so that the control processor 102 has access to either configuration storage memory 112 or the configuration registers via a MAC 108 controlled read operation.

After the control processor 102 instructs the MAC 108 to load the configuration data, it can then read the configuration registers back at 208 and route the configuration data from the configuration registers back to the control processor 102. The control processor 102 reads the expected verification results from configuration storage memory 112 at 212. The control processor 102 then performs a verification test on the data read from the configuration registers at 216. Any suitable method for verifying the configuration data can be used, including, but not limited to: a parity check, a checksum, a Cyclic Redundancy Check (CRC) algorithm, a direct data comparison (in which the configuration data itself can be considered to be the expected verification results), a one-way hash function, or any other suitable test method. Expected test results for each configuration (e.g. for checksum, CRC, and hash function) can be stored in configuration storage memory 112 or control processor memory (not pictured). These tests can be performed on all configuration bits, or on subsets of an entire configuration, which may be beneficial in RLSP systems where subsets of a configuration can be loaded individually without loading a complete set of configuration bits.

The procedure 208 for reading the configuration registers into the control processor 102 can be implemented immediately after the initial load of configuration bits and/or at any time thereafter while that configuration is still active. If the MAC 108 is designed to include a write flag to indicate any write to the configuration registers, the flag can be a condition checked by the control processor 102 to perform the initial or subsequent tests. The write-flag can then be cleared by the control processor 102 after a successful test.

In the event of a test result indicating an error in the configuration bits, the control processor 102 can implement an appropriate recovery procedure. Otherwise, the configuration can be activated at 220.

Figure 3:
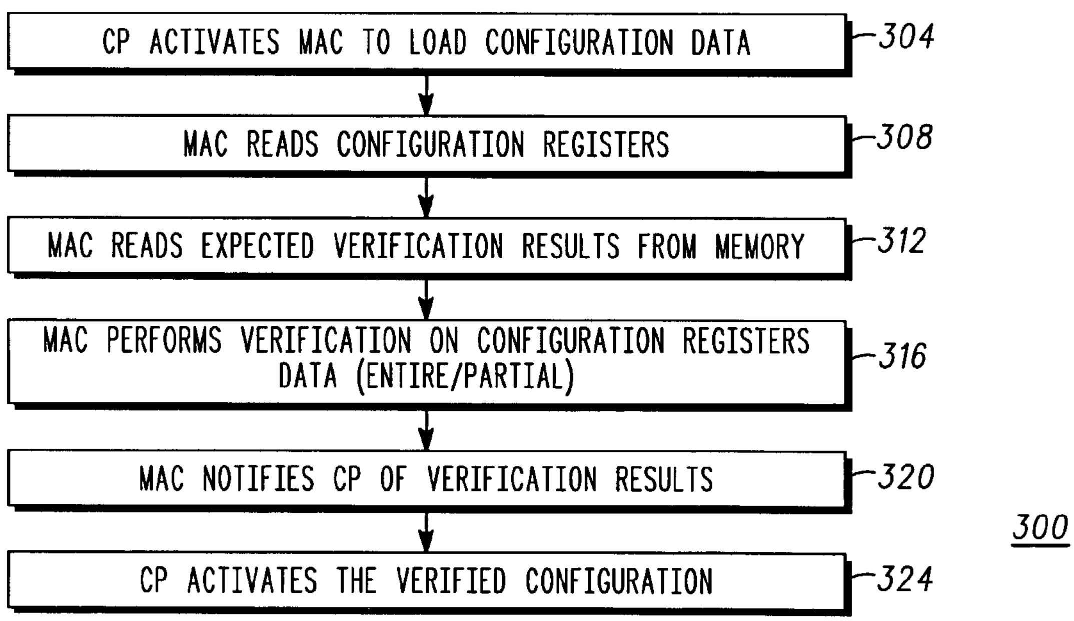
FIG. 3 is a flow chart depicting a second method of error checking a RLSP configuration consistent with certain embodiments of the present invention.

Referring to FIG. 1 in conjunction with FIG. 3, a second method 300 of FIG. 3 for verifying loaded configuration data uses memory access controller verification of the loaded configuration data. In this method the MAC 108 is designed with hardware/software necessary for implementing the verification algorithms internally. These algorithms include, but are not limited to a parity check, checksum, CRC, a direct data comparison (in which the configuration data itself can be considered to be the expected verification results), a one-way hash function, or any other suitable test method. The MAC 108 can internally keep track of any writes to the configuration registers, and subsequently perform a read-back of all configuration registers at 308 for internal verification. The MAC 108 reads the expected verification results from configuration memory 112 at 312. The MAC 108 then performs a verification test on the data at 316. The MAC 108 then informs the control processor 102 at 320 of the verification results. Expected test results for each configuration (e.g. for checksum, CRC, and hash function) can be stored in configuration storage memory 112 or control processor memory (not pictured). These tests can be performed on all configuration bits, or on subsets of an entire configuration, which may be beneficial in RLSP systems where subsets of a configuration can be loaded individually without loading a complete set of configuration bits.

In the event of a test result indicating an error in the configuration bits, the control processor 102 can implement an appropriate recovery procedure. Otherwise, the configuration can be activated at 324.

Figure 4:
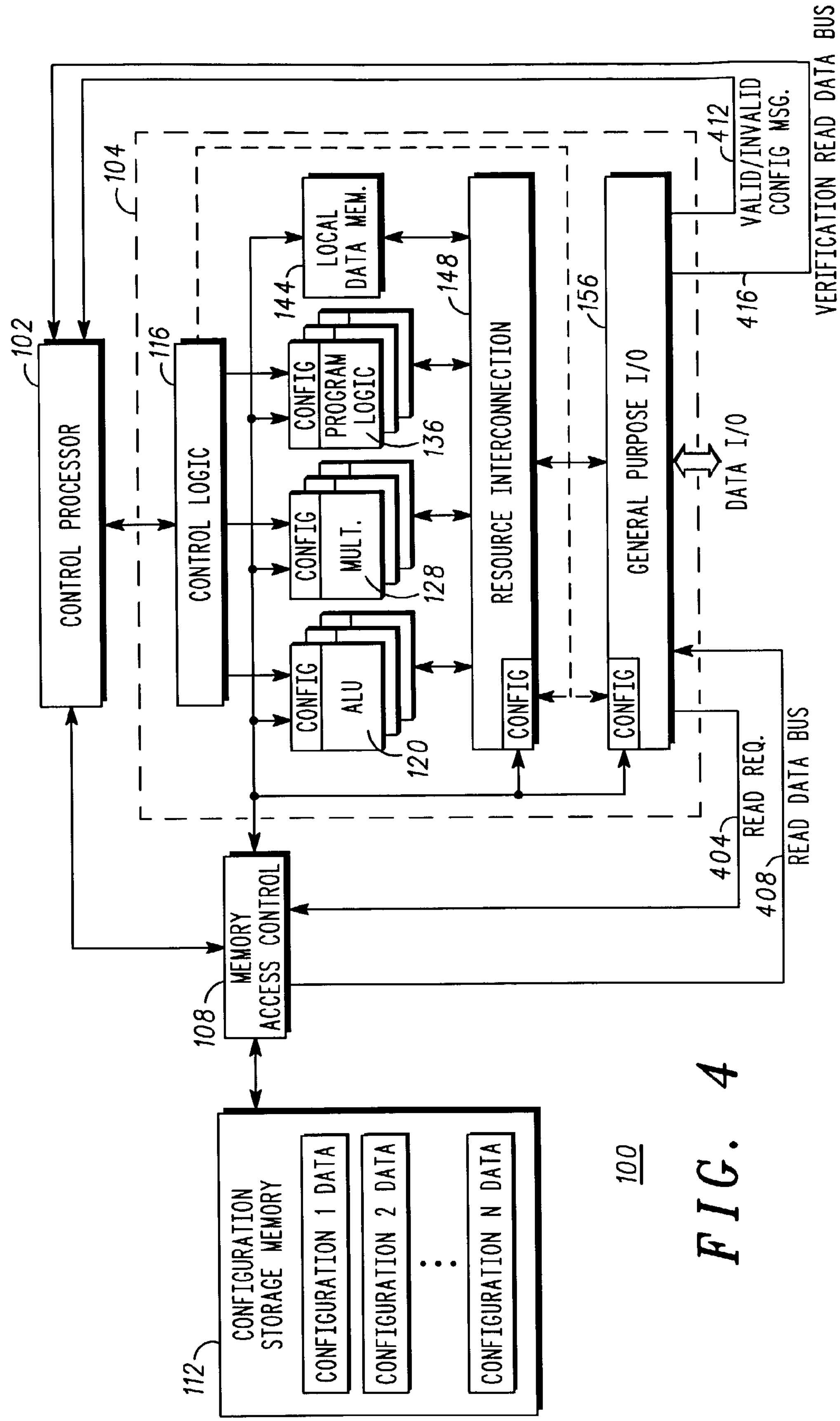
FIG. 4 is a block diagram depicting a second RLSP architecture consistent with certain embodiments of the present invention.
Figure 5:
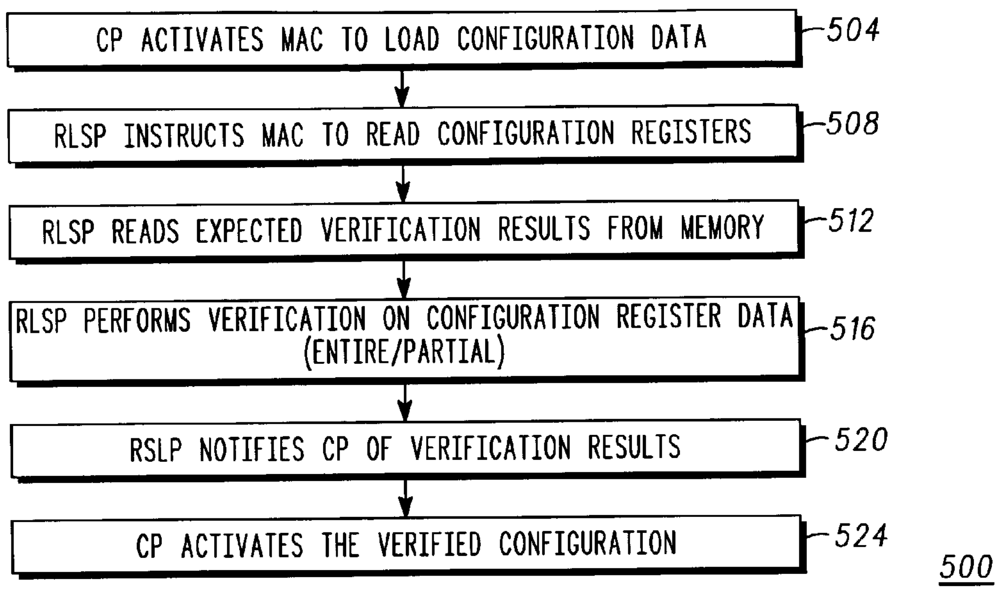
FIG. 5 is a flow chart depicting a third method of error checking a RSLP configuration consistent with certain embodiments of the present invention.

Referring to FIG. 4 in conjunction with FIG. 5, modifications to RLSP system 100 in FIG. 4 and a third method 500 in FIG. 5 uses reconfigurable resource verification of the loaded configuration data. A device consistent with one embodiment of the present invention is depicted wherein a modified reconfigurable logic signal processor (RLSP) system 100 is presented in FIG. 4. In this drawing there are additionally three new architectural features: a read request interface 404 from the reconfigurable resources 104 at the GPIO 156 to the MAC 108, a read data bus 408 from the MAC 108 to the reconfigurable resources 104 at the GPIO 156, and a VALID/INVALID configuration notification interface 412 from the reconfigurable resources 104 at the GPIO 156 to the control processor 102. An additional Verification Read Data Bus Interface 416 is available for passing verification results from the reconfigurable resources 104 to the Control Processor 102.

A Read-Only interface is designed from the Memory Access Controller (MAC) 108 to the General Purpose I/O (GPIO) 156 inputs of the reconfigurable resources 104. This interface has a read-request interface 404 from the GPIO 156 of the reconfigurable resources 104 to the MAC 108 and a read data bus interface 408 from the MAC 108 to the GPIO 156 on the reconfigurable resources 104. One or more ALU 120/MPY 128 units can be configured to perform a verification or error detection test on the configuration bits. After a new configuration is loaded at 504 into the configuration registers and activated, the portion of the reconfigurable resources 104 which are configured to test the configuration bits issue a request to the MAC 108 to read back the loaded configuration registers at 508 using read-request interface 404. The MAC 108 then routes the data back to the test-configured reconfigurable resources 104 via the read data bus interface 408. The reconfigurable resources 104 reads the expected verification results from configuration memory 112 at 512. The reconfigurable resources 104 then performs a verification test on the data at 516. The reconfigurable resources 104 then informs the control processor 102 at 520 of the verification results using the VALID/INVALID configuration notification interface 412.

The reconfigurable resources 104 can implement tests, including, but not limited to, simple parity checking, a simple checksum, CRC algorithm, a direct data comparison (in which the configuration data itself can be considered to be the expected verification results), a one-way hash function, or any other suitable test method. The test can be performed on all configuration bits, or on subsets of an entire configuration, which may be beneficial in RLSP systems where subsets of a configuration can be loaded individually without loading a complete set of configuration bits. The verification results can be stored in local data memory 144 and a simple valid/invalid result message sent to the control processor 102 via a configurable GPIO 156 output from the reconfigurable resources 104 to the control processor 102 using the VALID/INVALID configuration notification interface 412.

An alternative to method 500 is to store the expected results in the control processor memory (not shown). After completing the test, the test-configured reconfigurable resources 104 can send the test results to the control processor 102 via an additional verification read data bus interface 416 from reconfigurable resources 104 configured GPIO resources 156 to the control processor 102. The control processor 102 can then compare the test results with the expected results. This method eliminates a failure mode where the test-configured reconfigurable resources 104 themselves are corrupted but they still send a message indicating that there are no errors. The initial test can also be a prerequisite for activating the rest of the reconfigurable resources 104, via internal control signals.

In the event of a test result indicating an error in the configuration bits, the control processor 102 can implement an appropriate recovery procedure. Otherwise, the configuration can be activated at 524.

Figure 6:
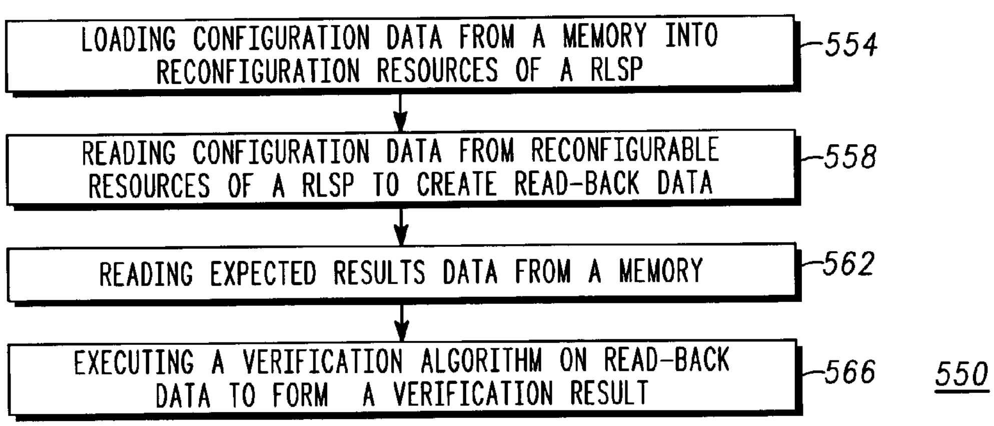
FIG. 6 is a flow chart depicting a general approach to reconfigurable logic signal processor (RLSP) error checking consistent with certain embodiments of the present invention.

Referring to FIG. 6, a general approach method 550 is shown for verification of a configuration for the reconfigurable resources 104 of a RLSP system 100 is considered. In this approach, configuration data are loaded from a memory into the reconfigurable resources 104 at 554. Reading the configuration data back from the reconfigurable resources 104 is done at 558. Reading of expected results data from a memory is done at 562. Execution of a verification algorithm is done at 566. Thus, a method consistent with certain embodiments of the invention can load configuration data from a configuration storage memory 112 into configuration registers in the reconfigurable resources 104, read back the configuration data from the configuration registers thereby creating a read-back data, read expected results data from the configuration storage memory 112, and execute a verification algorithm on the read-back data to form a verification result indicating an whether there is an error in the configuration of the RLSP system 100.

Figure 7:
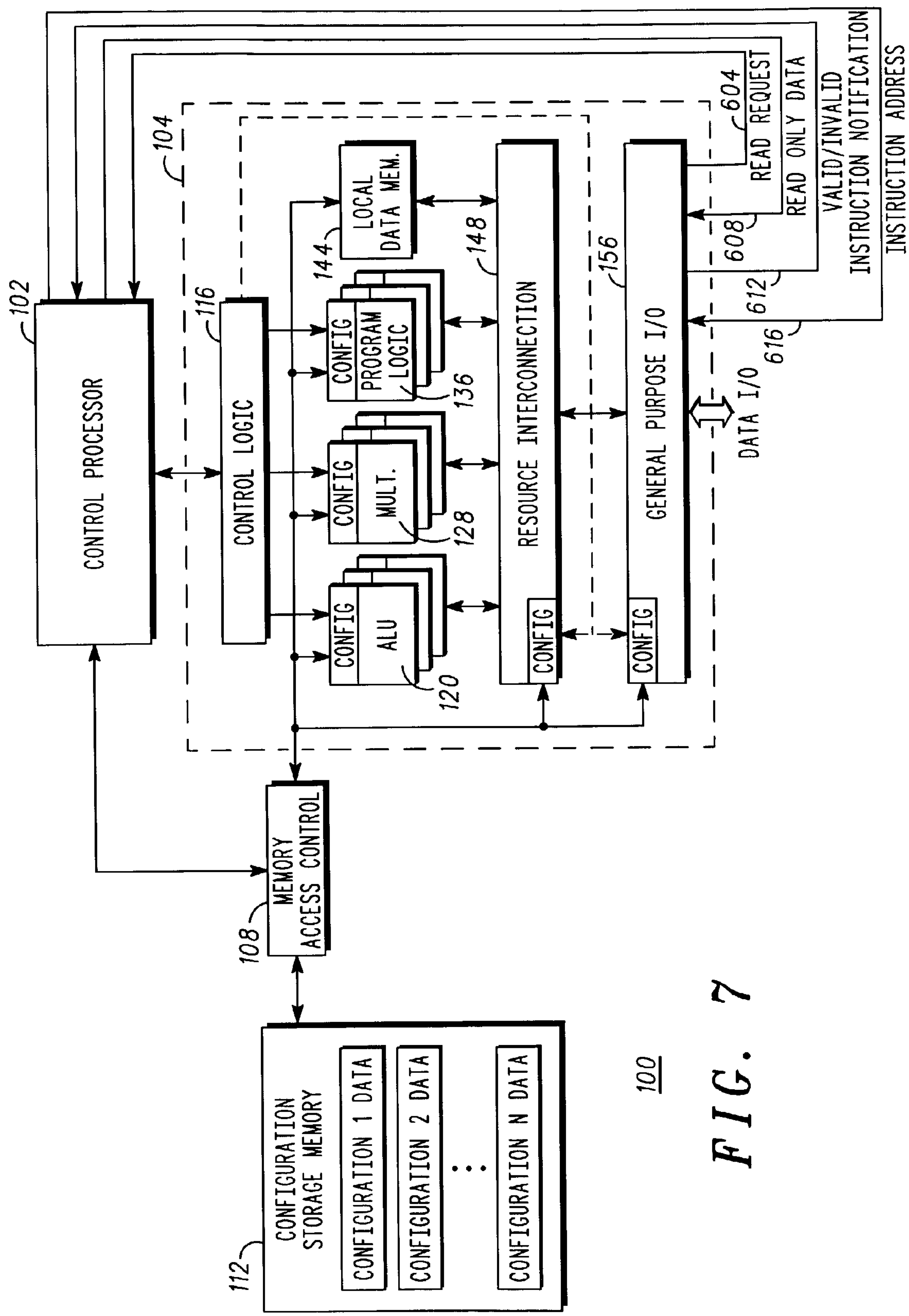
FIG. 7 is a block diagram depicting a third RLSP architecture consistent with certain embodiments of the present invention.
Figure 8:
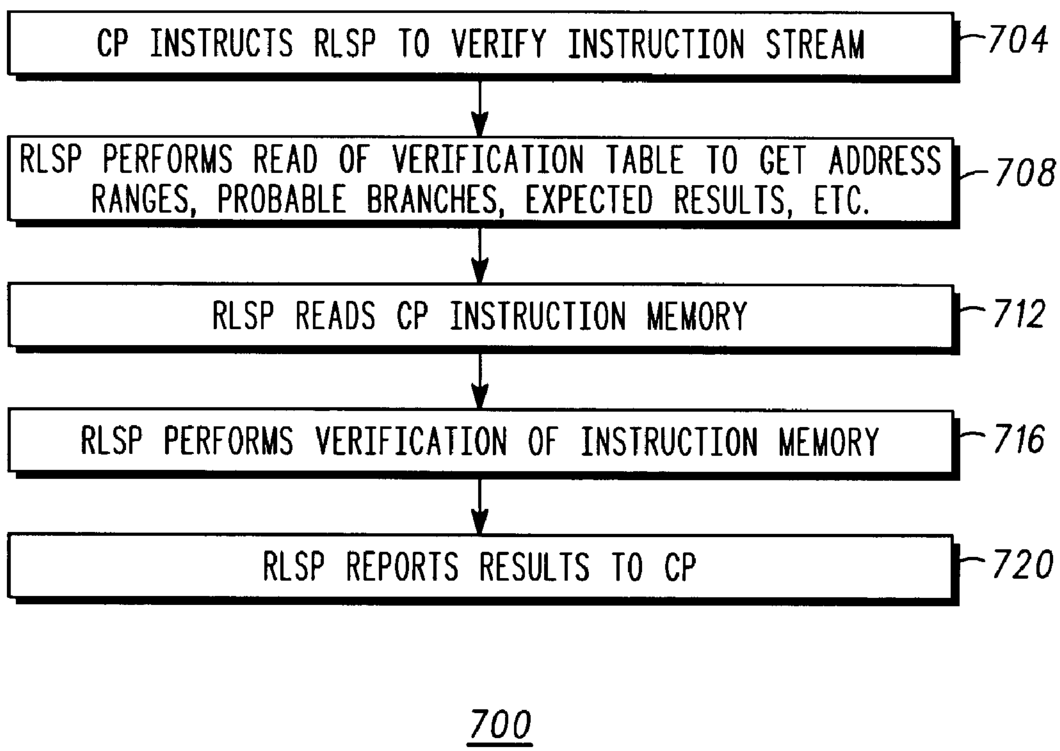
FIG. 8 is a flow chart depicting a method of error checking a control processor instruction stream consistent with certain embodiments of the present invention.

Referring to FIG. 7 and FIG. 8, modifications to RLSP system 100 in FIG. 7 and a method 700 of FIG. 8 utilizes a method for reconfigurable resource verification of control processor instructions. A device consistent with one embodiment of the present invention is depicted wherein a reconfigurable logic signal processor (RLSP) system 100 is presented in FIG. 7. In this drawing there are additionally four new architectural features: a read request interface 604 from the reconfigurable resources 104 at the GPIO 156 to the control processor 102, a read data bus interface 608 from the control processor 102 to the reconfigurable resources 104 at the GPIO 156, a VALID/INVALID instruction notification interface 612 from the reconfigurable resources 104 at the GPIO 156 to the control processor 102, and an instruction address interface 616 from the control processor 102 to the reconfigurable resources 104 at the GPIO 156.

A portion of the reconfigurable resources 104 (e.g. MPY 128 and ALU 120 units) are configured to perform error checking on the control processor 102's instruction data. Such error checking would normally require dedicated hardware to carry out. A read-only interface that has a read data bus interface 608 is configured from the control processor 102's instruction memory (not pictured) to the reconfigurable resources 104 GPIO 156 (either directly as illustrated, or through the MAC 108). The relevant GPIO 156 inputs are internally connected to the reconfigurable resources 104 configured to perform an instruction checking algorithm. A read request interface 604 and a VALID/INVALID instruction notification interface 612 are also configured from the reconfigurable resources 104 GPIO 156 to the control processor 102.

Once activated, the configured instruction checking algorithm can read a verification table at 708 to determine address ranges, probable branches, expected results, etc related to the instruction checking. The configured instruction checking algorithm can then read the control processor 102's instruction memory (which can be a part of the configuration storage memory 112 or may be a separate memory) at 712 and perform an instruction checking test (e.g. simple parity check, checksum, CRC check with expected results stored in memory, a direct data comparison (in which the configuration data itself can be considered to be the expected verification results), a one-way hash function, or any other suitable test method) at 716. The configuration of the instruction checking algorithm can have addresses (stored in local data memory) providing a range of instruction addresses to check and locations of associated checksum, CRC or hash expected test results.

The test-configured reconfigurable resources 104 can perform the instruction checking and compare the test with expected results. The test-configured reconfigurable resources 104 can then send a simple valid/invalid message to the control processor 102 using the VALID/INVALID instruction notification interface 612 at 720 to indicate test results.

Relative to previous methods, method 700 of FIG. 8 introduces the use of parallel resources to rapidly check the control processor 102's instructions in parallel with control processor 102 execution. In addition, one extension can be made to further optimize the use of the parallel resources. The instruction memory can be subdivided into blocks so the instruction checking can be performed separately for each of the blocks. Another read-only interface can be configured from the control processor 102 to the reconfigurable resources 104 at GPIO 156, so that the reconfigurable resources 104 test resources can read the control processor 102's current instruction address via the instruction address interface 616. Then the configured instruction-checking algorithm can track the control processor 102's instruction address and perform instruction checking on the block of instructions which contains the current instruction. This provides some limited capability of verifying near-future instructions for the control processor 102 (which may be a distinct general purpose microprocessor), which verification was previously unavailable.

In addition, a table can be created to list all instruction blocks. For each instruction block, the table can list the most likely future instruction blocks, or transition probabilities from the current instruction block to all other blocks. Then after completing verification of the current instruction block, the configured instruction-checking algorithm can use the table to prioritize instruction checking of other instruction blocks based on which are most likely to occur next. This optimizes speed of the instruction checking and increases the number of times the more frequently used blocks of instructions are checked.

Thus, a method consistent with some embodiments of the current invention can involve grouping the control processor 102's instructions into a plurality of instruction blocks for individual block verification, monitoring the control processor 102's current instruction address, identifying an instruction block containing the current instruction address, reading expected results data from a memory (note, this can be the same memory that stores data or instructions for a control processor 102), and executing a verification algorithm on the identified instruction block thereby creating a verification result indicating a condition of correctness of the identified instruction block.

Figure 9:
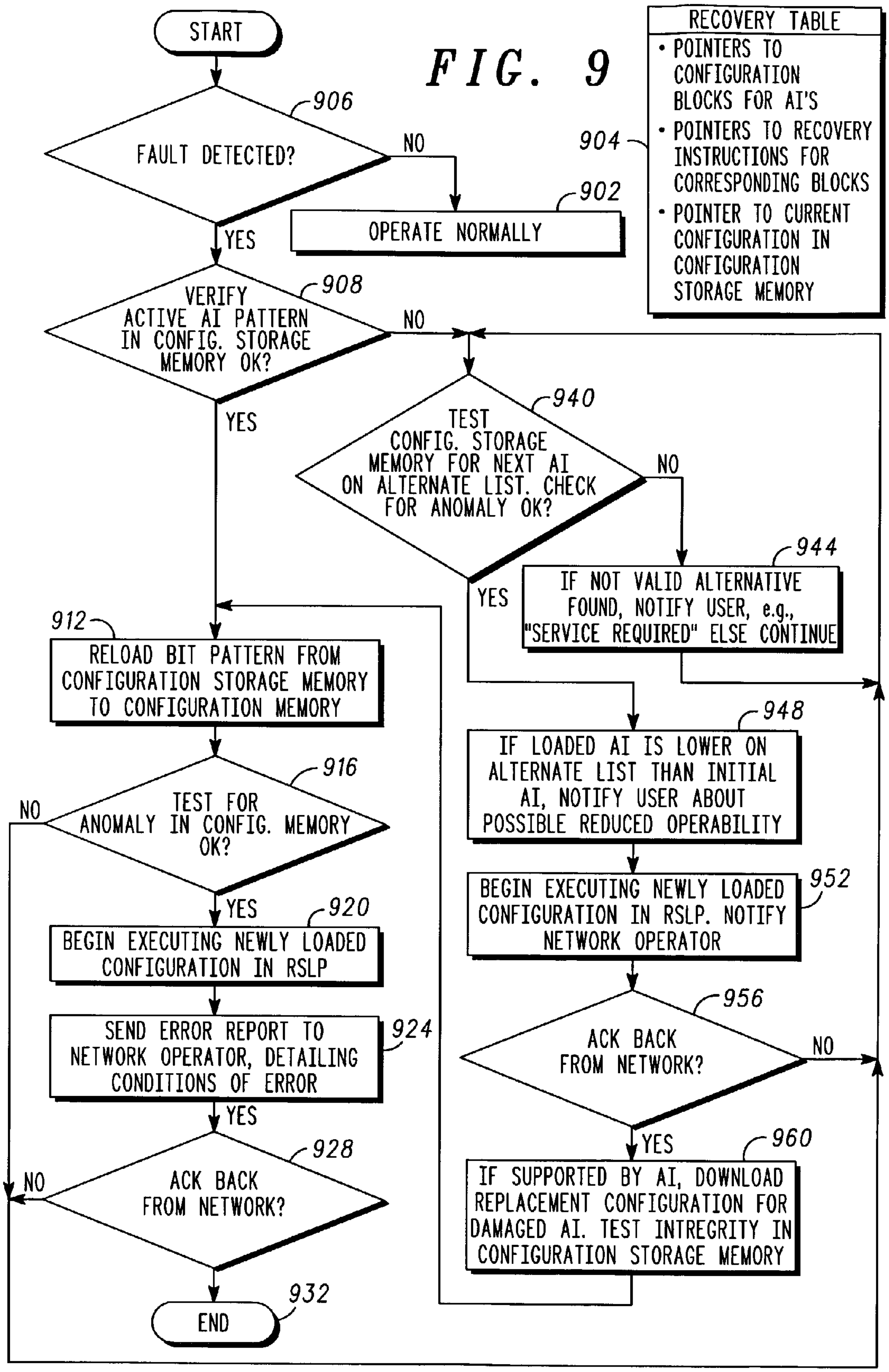
FIG. 9 is a flow chart depicting a SDR recovery procedure with RLSP consistent with certain embodiments of the present invention.

In the event that errors are found in a configuration (ie. using methods 200, 300, 500, or 550) during any of the methods previously discussed, a recovery procedure can be invoked to overcome the errors. Referring to FIG. 9, method 900 for recovery from errors is discussed. In this method a list of AI's in the user's location is maintained at a central database recovery table 904. The list can be downloaded manually or automatically, perhaps using Internet Protocol (IP) or Wireless Application Protocol (WAP) from a remote web server. (Depending on memory restrictions, the list over an entire region can be stored in the device.) Downloading data over the air is becoming ever simpler and is expected to be nearly trivial in 2.5G+(generation 2.5 and later of CDMA) AI's. The list of AI's is prioritized by some criteria, e.g. data speed, preference, interchangeability, etc. The device identifies an active AI in the list, that is, the AI which is currently in use by the device or the AI which is preferred to support specific services or a level of Quality of Service (QoS). Alternative AI's are kept for potential use in the recovery procedure in the recovery table 904. Checks are performed on the integrity of the configuration storage memory 112 and the configuration memory distributed throughout the reconfigurable resources 104. If an error is identified in the active AI at 906 (i.e. an anomaly in the bit pattern currently loaded into the reconfigurable resources 104 of the RLSP system 100) a procedure such as in 908 is started, wherein the configuration bit pattern is verified in configuration storage memory 112. Otherwise, normal operation is continued at 902.

If the configuration bit pattern in configuration storage memory 112 is found to be error free at 908, it is reloaded from configuration storage memory 112 to the reconfigurable resources 104 at 912. Otherwise, a transition to testing of the next prioritized AI in configuration storage memory at 940 whose subsequent detail is described below. When the configuration bit pattern is reloaded at 912, a verification of the reloaded configuration in the reconfigurable resources 104 is done at 916. If the verification algorithm indicates that the configuration in the reconfigurable resources is not in error at 916, the reloaded configuration is activated at 920 and an error report is sent to the network operator at 924.

When an acknowledgement is received from the network operator at 928, the recovery procedure is complete and execution continues normally at 932. If an acknowledgement is not received from the network at 928 a transition to the recovery table 904 occurs which routes subsequently to a test of the next prioritized AI in configuration storage memory at 940. If no valid alternative is found in configuration storage memory 112, the user is notified of a "service required" condition at 944. Otherwise, the user is notified of potential service degradation at 948 and the alternate lower priority AI is loaded at 948. The newly loaded lower priority AI is executed at 952 and a notification is sent to the network operator.

If an acknowledgement is received from the network operator at 956 and if supported, downloading of the higher priority AI is done at 960 over the network and replaced in configuration storage memory 112 at 960. Otherwise, as previously discussed, a transition to check configuration storage memory 112 for an alternate lower priority AI is done at 940. When the acknowledgement is received from the network operator, the integrity of the downloaded and stored higher priority AI is also done at 960. A transition, as previously discussed is made to reload the configuration bit pattern of the higher priority AI at 912.

A method can be described for error checking a reconfigurable logic signal processor (RLSP) configuration. The method involves loading a first configuration from a memory into the RLSP system 100's reconfigurable resources 104, activating the first configuration, testing the first configuration for errors, determining that the first configuration has errors, deactivating the first configuration that has errors, and verifying the first configuration in the memory. If no errors are found in the first configuration in the memory, reloading the first configuration from the memory can be done as can reactivating the first configuration. If errors are found in the first configuration in the memory, verifying a second configuration in the memory can be done. If no errors are found in the second configuration in the memory, loading the second configuration from the memory can be done, as can activating the second configuration.

Those skilled in the art will recognize that many enhancements can be added to complement the methods described above and are possibilities for specific realizations of the invention. Such complimentary features are not intended to limit the scope of the invention in any way. By way of example, there could be a base configuration, e.g. "safe mode" established. Perhaps the base configuration is a particular AI which could "build up" to a minimum working configuration. There could be certain criteria to determine if a present configuration is unstable: for example, Bit Error Rate (BER)>threshold, no ack-back from network, bad CRC on configuration bits, on command of network, user override, other updateable criteria. Errors, e.g. memory exceptions or bad CRC, could be reported to the network. Sending of an offending configuration to network would allow failure mode analysis to be done. Failure mode analysis could yield information about whether system related physical phenomenon such as electrostatic discharge (ESD) or hacker related activity may have caused the problem. If the error is found to be network related, the network could be analyzed, repaired, restored. Problem reporting could be augmented to send offending contents of registers, thereby allowing problem profiling. Network instructions could be established such as orders to powerdown unstable RLSP blocks if they consistently malfunction. In this case, a more minimal AI configuration could run on a smaller subset of the RLSP. A list of in-area available AI's (which are downloaded or discovered by device) in recovery procedures to reconnect to network service provider(s) could be maintained. An alternative to this would be trying all AI's for which software is stored in device, which may take longer if only a small number of device-supported AI's are available in the region. Automatic notification to the network of impaired/reduced operability (i.e. if GSM is main service and GSM voice coding software is corrupted, notify service via packet data that voice is not operable, pending attempted software recovery procedure) could be implemented. Automatic software download request by a device following detected software corruption could be implemented. An ability of a device/system to request/download specific portion of software necessary to patch corrupted software (as opposed to entire software routine) could be implemented. A device could create/maintain a local backup copy of software necessary to implement a subset of the AI's in the in-area AI list (for example, device always makes a backup copy of "active" AI). The backup copy's could be tested before a new AI is considered. Recovery procedure could be used for microcode stored in RAM for traditional microprocessors and DSP's, where sections of code are checked for errors in a manner similar to the RLSP configuration.

Those skilled in the art will appreciate that manufacturer's may choose to utilize maximum integration to produce a fully integrated RLSP system embracing all of the major components of RLSP system 100. However, manufacturers may also choose to fabricate individual parts of the architecture and utilize off-the-shelf memory, control processors etc. Any such combination of integrated and non-integrated resources could be utilized to realize embodiments of the current invention without limitation. Moreover, while the present reconfigurable resources were shown to have ALU, Multiplier, Programmable logic, local data memory, resource interconnections and general purpose I/O blocks that could be reconfigured, other reconfigurable resources may have some or all of the above as well as other reconfigurable resources without departing from the invention. Furthermore, those skilled in the art will recognize that the configuration registers described to hold the configuration data within the reconfigurable resources 104 could be implemented in a number of different ways, for example: as flip-flops, latches, volatile memory, non-volatile memory, etc.

Those skilled in the art will recognize that the error recovery aspects of the present invention have been described in terms of exemplary embodiments based upon use of a programmed processor. However, the invention should not be so limited, since the present invention could be implemented using hardware component equivalents such as special purpose hardware and/or dedicated processors which are equivalents to the invention as described and claimed. Similarly, general purpose computers, microprocessor based computers, micro-controllers, optical computers, analog computers, dedicated processors and/or dedicated hard wired logic may be used to construct alternative equivalent embodiments of the present invention.

Those skilled in the art will appreciate that the program steps and associated data used to implement the error recovery processes of certain embodiments described above could be implemented using any suitable electronic storage medium such as for example disc storage, Read Only Memory (ROM) devices, Random Access Memory (RAM) devices; optical storage elements, magnetic storage elements, magneto-optical storage elements, flash memory, core memory and/or other equivalent storage technologies without departing from the present invention. Such alternative storage devices should be considered equivalents.

The present invention, as described in embodiments herein, is implemented using programmed processors (RLSP control processor 102 and/or other processors including the reconfigurable resources 104 of the RLSP system 100) executing programming instructions that are broadly described above in flow chart form that could be stored on any suitable electronic storage medium (e.g., disc storage, optical storage, semiconductor storage, etc.) or transmitted over any suitable electronic communication medium. However, those skilled in the art will appreciate that the processes described above could be implemented in any number of variations and in many suitable programming languages without departing from the present invention. For example, the order of certain operations carried out could often be varied, additional operations could be added or operations could be deleted without departing from the invention. Error trapping could be added and/or enhanced and variations could be made in user interface and information presentation without departing from the present invention. Such variations are contemplated and considered equivalent.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A method of error checking a reconfigurable logic signal processor (RLSP) configuration, comprising:

loading configuration data from a memory into reconfigurable resources of said RLSP;

activating said RLSP configuration after loading said configuration in order to perform functions associated with the activated configuration;

after activating said RLSP configuration, reading back said configuration data from said reconfigurable resources thereby creating read-back data;

reading expected results data from said memory; and executing a verification algorithm on said read-back data thereby creating a verification result indicating a condition of correctness of said first RLSP configuration.

2. A method of error checking a reconfigurable logic signal processor (RLSP) configuration as in claim 1, further comprising reporting said verification result of said RLSP configuration to a control processor.

3. A method of error checking a reconfigurable logic signal processor (RLSP) configuration as in claim 1, wherein said configuration is a first configuration, further comprising:

determining from said verification result that said first configuration has errors;

deactivating said first configuration that has errors;

verifying said first configuration in said memory; and if no errors are found in said first configuration in said memory reloading said first configuration from said memory.

4. A method of error checking a reconfigurable logic signal processor (RLSP) configuration as in claim 3, further comprising activating said reloaded first configuration.

5. A method of error checking a reconfigurable logic signal processor (RLSP) configuration as in claim 3, wherein:

if errors are found in said first configuration in said memory verifying a second configuration in said memory; and if no errors are found in said second configuration in said memory loading said second configuration from said memory.

6. A method of error checking a reconfigurable logic signal processor (RLSP) configuration as in claim 5, further comprising activating said loaded second configuration.

7. A method of error checking a reconfigurable logic signal processor (RLSP) configuration as in claim 1, further comprising activating said RLSP configuration after verifying said configuration.

8. A method of error checking a reconfigurable logic signal processor (RLSP) configuration as in claim 1, wherein said loading is carried out by one of a control processor, a memory access controller (MAC), and said reconfigurable resources of said RLSP.

9. A method of error checking a reconfigurable logic signal processor (RLSP) configuration as in claim 1, wherein said reading back said configuration from said RLSP is carried out by one of a control processor, a memory access controller (MAC), and said reconfigurable resources of said RLSP.

10. A method of error checking a reconfigurable logic signal processor (RLSP) configuration as in claim 1, wherein said reading said expected results data from said memory is carried out by one of a control processor, a memory access controller (MAC), and said reconfigurable resources of said RLSP.

11. A method of error checking a reconfigurable logic signal processor (RLSP) configuration as in claim 1, wherein said executing of said verification algorithm is carried out by one of a control processor, a memory access controller (MAC), and said reconfigurable resources of said RLSP.

12. A method of error checking a reconfigurable logic signal processor (RLSP) configuration as in claim 11, wherein when said executing of said verification algorithm is carried out by said reconfigurable resources of said RLSP, and further comprising releasing said reconfigurable resources of said RLSP after said execution of said verification algorithm is completed.

13. A method of error checking a reconfigurable logic signal processor (RLSP) configuration as in claim 11, further comprising switching to said mirror register set for RLSP operation.

14. A method of error checking a reconfigurable logic signal processor (RLSP) configuration as in claim 1, wherein said verification algorithm comprises one of a parity calculation, a cyclical redundancy check (CRC), a checksum calculation, a hash function calculation, and a direct data comparison.

15. A method of error checking a reconfigurable logic signal processor (RLSP) configuration as in claim 1, wherein said loading said configuration from said memory into said reconfigurable resources of said RLSP is effected upon one of a plurality of mirror register sets each identical to a configuration register set that fully defines said configuration of said RLSP.

16. An apparatus for error checking a reconfigurable logic signal processor (RLSP) configuration, comprising:

- means for loading configuration data from a memory into reconfigurable resources of said RLSP;
- means for activating said first RLSP configuration after loading said configuration in order to perform functions associated with the activated configuration;
- means for reading back said configuration data from said reconfigurable resources of said RLSP after activating said RLSP configuration thereby creating read-back data;
- means for reading expected results data from said memory; and
- means for executing a verification algorithm on said read-back data thereby creating a verification result indicating a condition of correctness of said RLSP configuration.

17. An apparatus for error checking a reconfigurable logic signal processor (RLSP) configuration as in claim 16, wherein said means for loading a configuration from a memory into said RLSP comprises a memory access controller (MAC).

18. An apparatus for error checking a reconfigurable logic signal processor (RLSP) configuration as in claim 16, wherein said means for reading back said configuration from said RLSP comprises one of a control processor, a memory access controller (MAC), and said reconfigurable resources of said RLSP.

19. An apparatus for error checking a reconfigurable logic signal processor (RLSP) configuration as in claim 16, wherein said means for reading said expected results data from said memory comprises one of a control processor, a memory access controller (MAC), and said reconfigurable resources of said RLSP.

20. An apparatus for error checking a reconfigurable logic signal processor (RLSP) configuration as in claim 16, wherein said means for executing said verification algorithm on said read-back data comprises one of a control processor, a memory access controller (MAC), and said reconfigurable resources of said RLSP.

21. A method of error checking a control processor s instructions using a reconfigurable logic signal processor (RLSP), comprising:

- loading configuration data from a memory into reconfigurable resources of said RLSP;
- activating said RLSP configuration after loading said configuration in order to perform functions associated with the activated configuration;
- grouping said control processor's instructions into a plurality of instruction blocks for individual block verification;
- monitoring said control processor's current instruction address;
- identifying an instruction block containing the current instruction address;
- after activating said RLSP configuration, reading expected results data from a memory; and
- executing a verification algorithm on said identified instruction block thereby creating a verification result indicating a condition of correctness of said identified instruction block.

22. A method of error checking a control processor's instructions using a reconfigurable logic signal processor (RLSP) as in claim 21, further comprising reporting anomalies of said instructions to said control processor.

23. A method of error checking a reconfigurable logic signal processor (RLSP) configuration, comprising:

- loading a first configuration from a memory into said RLSP;
- activating said first configuration;
- testing said first configuration for errors;
- determining that said first configuration has errors;
- deactivating said first configuration that has errors;
- verifying said first configuration in said memory; and
- if no errors are found in said first configuration in said memory reloading said first configuration from said memory; and
  - reactivating said first configuration.

24. A method of error checking a reconfigurable logic signal processor (RLSP) configuration in claim 23, wherein:

- if errors are found in said first configuration in said memory verifying a second configuration in said memory; and
  - if no errors are found in said second configuration in said memory loading said second configuration from said memory; and
    - activating said second configuration.

25. A method of error checking a reconfigurable logic signal processor (RLSP) configuration, comprising:

- storing a plurality of sets of configuration data each capable of configuring said RLSP to process a local air interface (AI) standard for a wireless communication system or part thereof in a memory;
- prioritizing said plurality of sets of configuration data in said memory;
- loading a first high priority set of configuration data representing a first high priority configuration to enable a high priority local AI from said prioritized plurality of sets of configuration data from said memory into said reconfigurable resources of said RLSP;
- activating said first high priority configuration;
- executing a verification algorithm on said first high priority configuration;

determining that said first high priority configuration has errors;

deactivating said first high priority configuration that has errors;

loading a second lower priority set of configuration data representing a second lower priority configuration to enable a lower priority local AI from said prioritized plurality of sets of configuration data from said memory into said reconfigurable resources of said RLSP;

activating said second lower priority configuration;

executing a verification algorithm on said second lower priority configuration;

determining that said second lower priority configuration has no errors;

notifying a wireless communication network of said high priority configuration that has errors using said second lower priority configuration;

downloading said first high priority set of configuration data from said wireless communication network using said second lower priority configuration;

storing said first high priority set of configuration data into said prioritized plurality of sets of configuration data in said memory;

reloading said first high priority set of configuration data to reenable said high priority local AI from said prioritized plurality of sets of configuration data from said memory into said reconfigurable resources of said RLSP;

reactivating said first high priority configuration;

executing a verification algorithm on said first high priority configuration; and determining that said first high priority configuration has no errors.

* * * * *